United States Patent
Gold et al.

(10) Patent No.: US 9,672,905 B1
(45) Date of Patent: Jun. 6, 2017

(54) OPTIMIZE DATA PROTECTION LAYOUTS BASED ON DISTRIBUTED FLASH WEAR LEVELING

(71) Applicant: Pure Storage, Inc., Mountain View, CA (US)

(72) Inventors: Brian Gold, Mountain View, CA (US); John Hayes, Mountain View, CA (US); Robert Lee, Mountain View, CA (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

(21) Appl. No.: 15/292,004

(22) Filed: Oct. 12, 2016

Related U.S. Application Data

(60) Provisional application No. 62/365,852, filed on Jul. 22, 2016.

(51) Int. Cl.
*G11C 8/00* (2006.01)
*G11C 11/56* (2006.01)
*G11C 16/34* (2006.01)
*G06F 3/06* (2006.01)

(52) U.S. Cl.
CPC ........ *G11C 11/5635* (2013.01); *G06F 3/0611* (2013.01); *G06F 3/0659* (2013.01); *G06F 3/0679* (2013.01); *G11C 11/5628* (2013.01); *G11C 16/3495* (2013.01)

(58) Field of Classification Search
USPC .......... 365/230.03, 189.011, 189.15, 189.16
See application file for complete search history.

(56) References Cited

U.S. PATENT DOCUMENTS

| | | |
|---|---|---|
| 6,725,392 B1 | 4/2004 | Frey et al. |
| 6,952,794 B2 | 10/2005 | Lu |
| 6,961,890 B2 | 11/2005 | Smith |
| 7,151,694 B2 | 12/2006 | Meihong et al. |
| 7,472,331 B2 | 12/2008 | Kim |
| 7,509,645 B2 | 3/2009 | Coates et al. |
| 7,640,452 B2 | 12/2009 | Chen et al. |

(Continued)

FOREIGN PATENT DOCUMENTS

| | | |
|---|---|---|
| WO | WO 2008103569 | 8/2008 |
| WO | WO 2012044489 | 4/2012 |
| WO | WO 2013030217 | 3/2013 |

OTHER PUBLICATIONS

Savill, John; Introduction to Cluster Shared Volumes, Aug. 14, 2011. http://windowsitpro.com/high-availability/introduction-cluster-shared-volumes.

(Continued)

*Primary Examiner* — Vu Le
(74) *Attorney, Agent, or Firm* — Womble Carlyle Sandridge & Rice LLP

(57) ABSTRACT

A method for storing data in a storage system having solid-state memory is provided. The method includes determining portions of the solid-state memory that have a faster access rate and portions of the solid-state memory that have a slower access rate, relative to each other or to a threshold. The method includes writing data bits of erasure coded data to the portions of the solid-state memory having the faster access rate, and writing one or more parity bits of the erasure coded data to the portions of the solid-state memory having the slower access rate. A storage system is also provided.

20 Claims, 9 Drawing Sheets

(56) References Cited

U.S. PATENT DOCUMENTS

| | | |
|---|---|---|
| 7,778,960 B1 | 8/2010 | Chatterjee et al. |
| 7,869,383 B2 | 1/2011 | Tabbara et al. |
| 7,908,448 B1 | 3/2011 | Chatterjee et al. |
| 8,010,485 B1 | 8/2011 | Chatterjee et al. |
| 8,010,829 B1 | 8/2011 | Chatterjee et al. |
| 8,046,548 B1 | 10/2011 | Chatterjee et al. |
| 8,051,361 B2 | 11/2011 | Sim-Tang et al. |
| 8,065,573 B2 | 11/2011 | Abts et al. |
| 8,081,512 B2 | 12/2011 | Ueno et al. |
| 8,086,911 B1 | 12/2011 | Taylor |
| 8,103,904 B2 | 1/2012 | Hafner et al. |
| 8,145,838 B1 | 3/2012 | Miller et al. |
| 8,156,392 B2 | 4/2012 | Flynn et al. |
| 8,195,688 B1 | 6/2012 | Sawhney et al. |
| 8,244,999 B1 | 8/2012 | Chatterjee et al. |
| 8,281,023 B2 | 10/2012 | Dondeti et al. |
| 8,296,625 B2 | 10/2012 | Diggs et al. |
| 8,327,080 B1 | 12/2012 | Der |
| 8,429,492 B2 | 4/2013 | Yoon et al. |
| 8,458,287 B2 | 6/2013 | Ozzie et al. |
| 8,473,778 B2 | 6/2013 | Simitci et al. |
| 8,479,037 B1 | 7/2013 | Chatterjee et al. |
| 8,498,967 B1 | 7/2013 | Chatterjee et al. |
| 8,522,073 B2 | 8/2013 | Cohen |
| 8,560,922 B2 | 10/2013 | Bivins et al. |
| 8,589,761 B2 | 11/2013 | Cronin et al. |
| 8,595,455 B2 | 11/2013 | Chatterjee et al. |
| 8,621,291 B2 | 12/2013 | Kinoshita |
| 8,627,136 B2 | 1/2014 | Shankar et al. |
| 8,683,277 B1 | 3/2014 | Varnica et al. |
| 8,700,875 B1 | 4/2014 | Barron et al. |
| 8,706,962 B2 | 4/2014 | Belluomini et al. |
| 8,760,922 B2 | 6/2014 | Lassa |
| 8,775,868 B2 | 7/2014 | Colgrove et al. |
| 8,775,901 B2 | 7/2014 | Sharon et al. |
| 8,799,746 B2 | 8/2014 | Baker et al. |
| 8,843,447 B2 | 9/2014 | Molaro et al. |
| 8,850,108 B1 | 9/2014 | Hayes et al. |
| 8,856,431 B2 | 10/2014 | Chen |
| 8,856,593 B2 | 10/2014 | Eckhardt et al. |
| 8,892,980 B2 | 11/2014 | Fillingim |
| 8,904,123 B2 | 12/2014 | Crawford et al. |
| 8,959,416 B1 | 2/2015 | Malonzo |
| 8,977,803 B2 | 3/2015 | Horn et al. |
| 9,009,565 B1 | 4/2015 | Northcott |
| 9,082,512 B1 | 7/2015 | Davis et al. |
| 9,122,699 B2 | 9/2015 | Molaro et al. |
| 9,263,136 B1 | 2/2016 | Zhao et al. |
| 9,299,455 B2 | 3/2016 | Suzuki et al. |
| 9,454,420 B1 | 9/2016 | Tai et al. |
| 2002/0172074 A1 | 11/2002 | Hsu et al. |
| 2004/0073747 A1 | 4/2004 | Lu |
| 2006/0236056 A1 | 10/2006 | Nagata |
| 2007/0268905 A1 | 11/2007 | Baker et al. |
| 2008/0117548 A1 | 5/2008 | Azuma et al. |
| 2008/0295118 A1 | 11/2008 | Liao |
| 2009/0319859 A1 | 12/2009 | Alrod et al. |
| 2010/0162076 A1 | 6/2010 | Sim-Tang et al. |
| 2010/0251077 A1 | 9/2010 | Kim et al. |
| 2010/0268908 A1 | 10/2010 | Ouyang et al. |
| 2010/0287335 A1 | 11/2010 | Chung et al. |
| 2011/0113075 A1 | 5/2011 | Fukushima |
| 2011/0307758 A1 | 12/2011 | Fillingim |
| 2012/0011398 A1 | 1/2012 | Eckhardt et al. |
| 2012/0066473 A1 | 3/2012 | Tremaine et al. |
| 2012/0079190 A1 | 3/2012 | Colgrove et al. |
| 2012/0079318 A1 | 3/2012 | Colgrove et al. |
| 2012/0166749 A1 | 6/2012 | Eleftheriou et al. |
| 2012/0239853 A1 | 9/2012 | Moshayedi |
| 2012/0239990 A1 | 9/2012 | Mataya |
| 2012/0272036 A1 | 10/2012 | Muralimanohar |
| 2012/0278511 A1 | 11/2012 | Alatorre et al. |
| 2012/0311557 A1 | 12/2012 | Resch |
| 2013/0031429 A1 | 1/2013 | Sharon et al. |
| 2013/0046920 A1 | 2/2013 | Ryu et al. |
| 2013/0060884 A1 | 3/2013 | Bernbo et al. |
| 2013/0117636 A1 | 5/2013 | Kim et al. |
| 2013/0132638 A1 | 5/2013 | Horn et al. |
| 2013/0173844 A1 | 7/2013 | Chen et al. |
| 2013/0198445 A1 | 8/2013 | Bando |
| 2013/0198449 A1 | 8/2013 | Belluomini et al. |
| 2013/0205183 A1 | 8/2013 | Fillingim |
| 2013/0232289 A1 | 9/2013 | Zhong et al. |
| 2013/0238836 A1 | 9/2013 | Suzuki et al. |
| 2013/0265825 A1 | 10/2013 | Lassa |
| 2013/0339818 A1 | 12/2013 | Baker et al. |
| 2014/0006733 A1 | 1/2014 | Seo et al. |
| 2014/0047263 A1 | 2/2014 | Coatney et al. |
| 2014/0092683 A1 | 4/2014 | Hyun et al. |
| 2014/0136880 A1 | 5/2014 | Shankar et al. |
| 2014/0136927 A1 | 5/2014 | Li et al. |
| 2014/0189421 A1 | 7/2014 | Werner et al. |
| 2014/0195558 A1 | 7/2014 | Murthy et al. |
| 2015/0052416 A1 | 2/2015 | Prohofsky et al. |
| 2015/0161036 A1 | 6/2015 | Camp et al. |
| 2016/0118129 A1* | 4/2016 | Muchherla ............ G11C 16/26 365/185.12 |

OTHER PUBLICATIONS

Xiao Qin et al.; "Measuring and Analyzing Write Amplification Characteristics of Solid State Disks"; Modeling, Analysis & Simulation of Computer and Telecommunication Systems (MASCOTS), 2013 IEEE 21st International Symposium on Aug. 2013. (http://www.researchgate.net/publication/262362154). See pp. 1-10.

Storer, Mark W., Greenan, Kevin M., Miller L. Ethan, Voruganti, Kaladhar; Pergamum: Replacing Tape with Energy Efficient, Reliable, Disk-Based Archival Storage.

Hwang, Kai, Jin, Hair, Ho, Roy; RAID-x: A New Distributed Disk Array for I/O-Centric Cluster Computing.

International Search Report, PCT/US2015/044368, mailed Feb. 17, 2016.

International Search Report, PCT/US2015/044355, mailed Feb. 16, 2016.

International Search Report, PCT/US2015/044205, mailed Nov. 19, 2015.

International Search Report and the Written Opinion of the International Searching Authority, PCT/US2015/044522, mailed Nov. 30, 2015.

International Search Report, PCT/US2015/011661, mailed Mar. 25, 2015.

C. S. Lin and L. R. Dung, "A NAND Flash Memory Controller for SD/MMC Flash Memory Card," in IEEE Transactions on Magnetics, vol. 43, No. 2, pp. 933-935, Feb. 2007.

D.H. Yoon, N. Muralimanohar, J. Chang, P. Ranganathan, N. P. Jouppi and M. Erez, "FREE-p: A Practical End-to-End Nonvolatile Memory Protection Mechanism," in IEEE Micro, vol. 32, No. 3, pp. 79-87, May-Jun. 2012.

D.H. Yoon, N. Muralimanohar, J. Chang, P. Ranganathan, N. P. Jouppi and M. Erez, "Free-p: Protecting non-volatile memory against both hard and soft errors," 2011 IEEE 17th International Symposium on High Performance Computer Architecture, San Antonio, TX, 2011, pp. 466-477.

* cited by examiner

OPTIMIZE DATA PROTECTION LAYOUTS BASED ON DISTRIBUTED FLASH WEAR LEVELING

BACKGROUND

Wear leveling (or wear-leveling), for flash or other type of solid-state memory, is a technique of tracking wear of the memory, usually by counting program/erase cycles, and placing data so as to distribute wear evenly about the memory. This prevents having highly worn parts of the memory with data that would then be error-prone and unreliable during reads. Wear leveling is thus a technique for assuring reliability of flash memory. But, wear leveling does not necessarily optimize memory for fast access of data, which would be desirable in a storage system. Therefore, there is a need in the art for a solution which overcomes the drawbacks described above.

SUMMARY

In some embodiments, a storage system is provided. The system includes a plurality of storage nodes having solid-state memory, each storage node of the plurality of storage nodes configurable to write data across the plurality of storage nodes using erasure coding, each portion of data having a plurality of data bits and one or more parity bits. Each storage node of the plurality of storage nodes is configurable to identify portions of the solid-state memory having a first access rate and portions of the solid state memory having a second access rate, the first access rate faster than the second access rate. Each storage node of the plurality of storage nodes is configurable to write the data bits to the portions of the solid-state memory having the first access rate and write the one or more parity bits to the portions of the solid-state memory having the second access rate.

In some embodiments, a solid-state memory storage system is provided. The system includes a plurality of storage nodes, at least a portion of the plurality of storage nodes having triple level cell flash memory for storage, the triple level cell flash memory having first pages with a first access rate and second pages with a second access rate, the first access rate faster than the second access rate. Each of the plurality of storage nodes is configurable to associate the first access rate to first data and associate the second access rate to second data. Each of the plurality of storage nodes is configurable to write the first data to the first pages having the first access rate and write the second data to the second pages having the second access rate.

In some embodiments, a method for storing data in a storage system having solid-state memory is provided. The method includes determining portions of the solid-state memory that have a faster access rate and portions of the solid-state memory that have a slower access rate, relative to each other or to a threshold. The method includes writing data bits of erasure coded data to the portions of the solid-state memory having the faster access rate, and writing one or more parity bits of the erasure coded data to the portions of the solid-state memory having the slower access rate.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
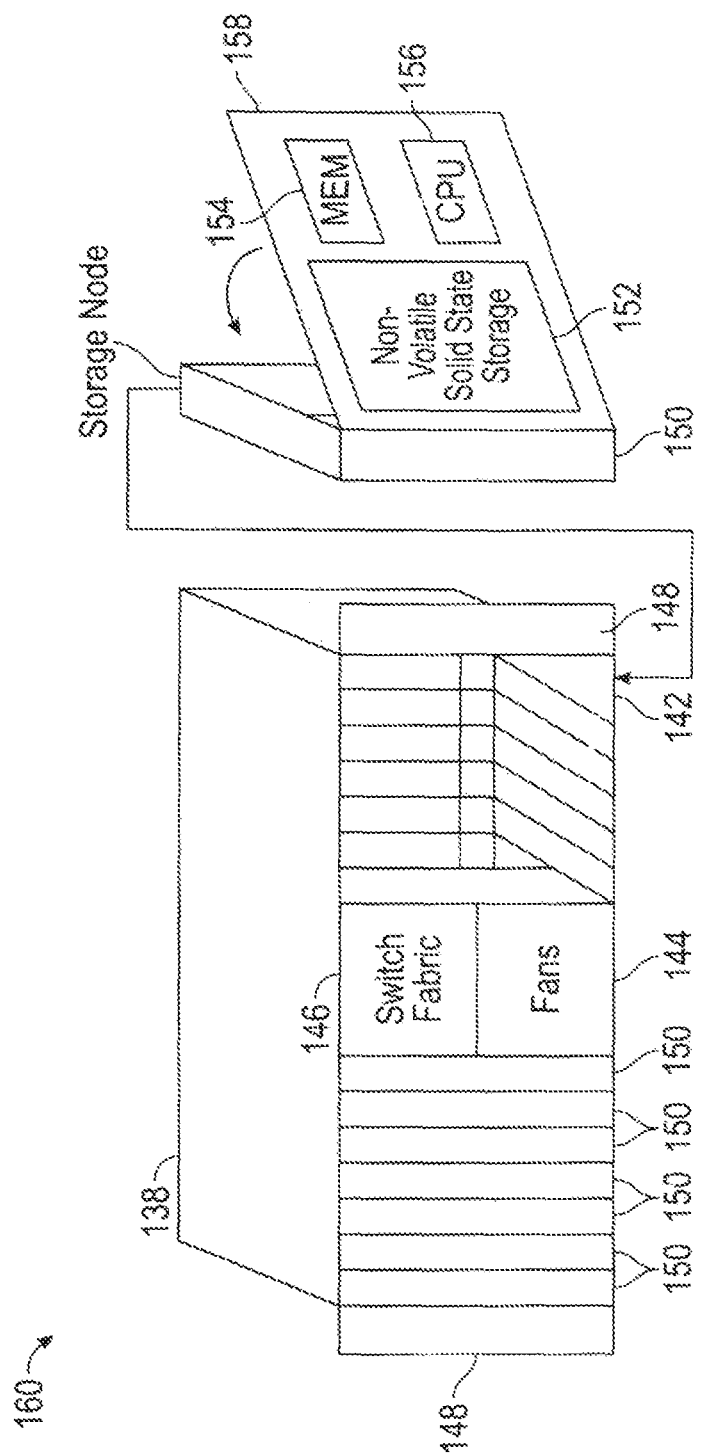
FIG. 1 is a perspective view of a storage cluster with multiple storage nodes and internal storage coupled to each storage node to provide network attached storage, in accordance with some embodiments.

Various storage systems described herein, and further storage systems, can be optimized for distribution of selected data, according to various criteria, in flash or other solid-state memory. The embodiments for the distributed flash wear leveling system are optimized for faster read access to the flash or other solid-state memory. Flash memory that is worn, i.e., that has a large number of program/erase cycles, often or usually has a greater error rate during read accesses, and this adds to read latency for data bits as a result of the processing time overhead to perform error correction. Various embodiments of the storage system track program/erase cycles, or track read errors or error rates, for example on a page, block, die, package, board, storage unit or storage node basis, are aware of faster and slower types or designs of flash memory or portions of flash memory, or otherwise determine relative access speeds for flash memory. The storage system then places data selectively in faster access or slower access locations in or portions of flash memory (or other solid-state memory). One embodiments of the storage system writes data bits to faster access portions of flash memory and parity bits to slower access portions of flash memory. Another embodiment takes advantage of faster and slower access pages of triple level cell flash memory. Principles of operation, variations, and implementation details for distributed flash wear leveling are further discussed below, with reference to FIGS. 6-13, following description of embodiments of a storage cluster with storage nodes, suitable for distributed flash wear leveling, with reference to FIGS. 1-5.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 1, storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2:
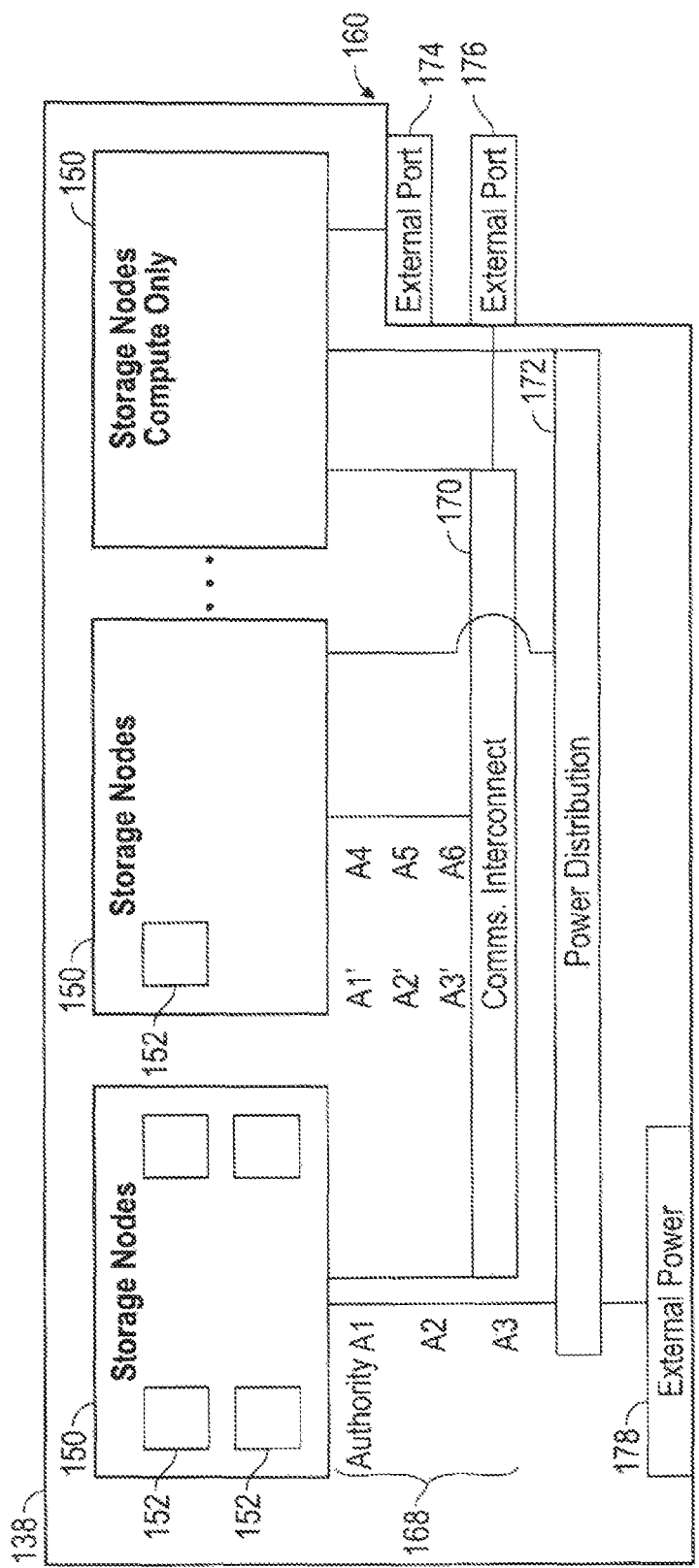
FIG. 2 is a block diagram showing an interconnect switch coupling multiple storage nodes in accordance with some embodiments.

FIG. 2 is a block diagram showing a communications interconnect 170 and power distribution bus 172 coupling multiple storage nodes 150. Referring back to FIG. 1, the communications interconnect 170 can be included in or implemented with the switch fabric 146 in some embodiments. Where multiple storage clusters 160 occupy a rack, the communications interconnect 170 can be included in or implemented with a top of rack switch, in some embodiments. As illustrated in FIG. 2, storage cluster 160 is enclosed within a single chassis 138. External port 176 is coupled to storage nodes 150 through communications interconnect 170, while external port 174 is coupled directly to a storage node. External power port 178 is coupled to power distribution bus 172. Storage nodes 150 may include varying amounts and differing capacities of non-volatile solid state storage 152 as described with reference to FIG. 1. In addition, one or more storage nodes 150 may be a compute only storage node as illustrated in FIG. 2. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of Mode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an Mode number or a data segment number. The output of this operation points to a non-volatile solid state storage 152 having the authority 168 for that particular piece of data. In some embodiments there are two stages to this operation. The first stage maps an entity identifier (ID), e.g., a segment number, Mode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 1 and 2, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or Mode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain metadata, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIG. 5) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Inodes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots.

Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage unit 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being trasmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 3:
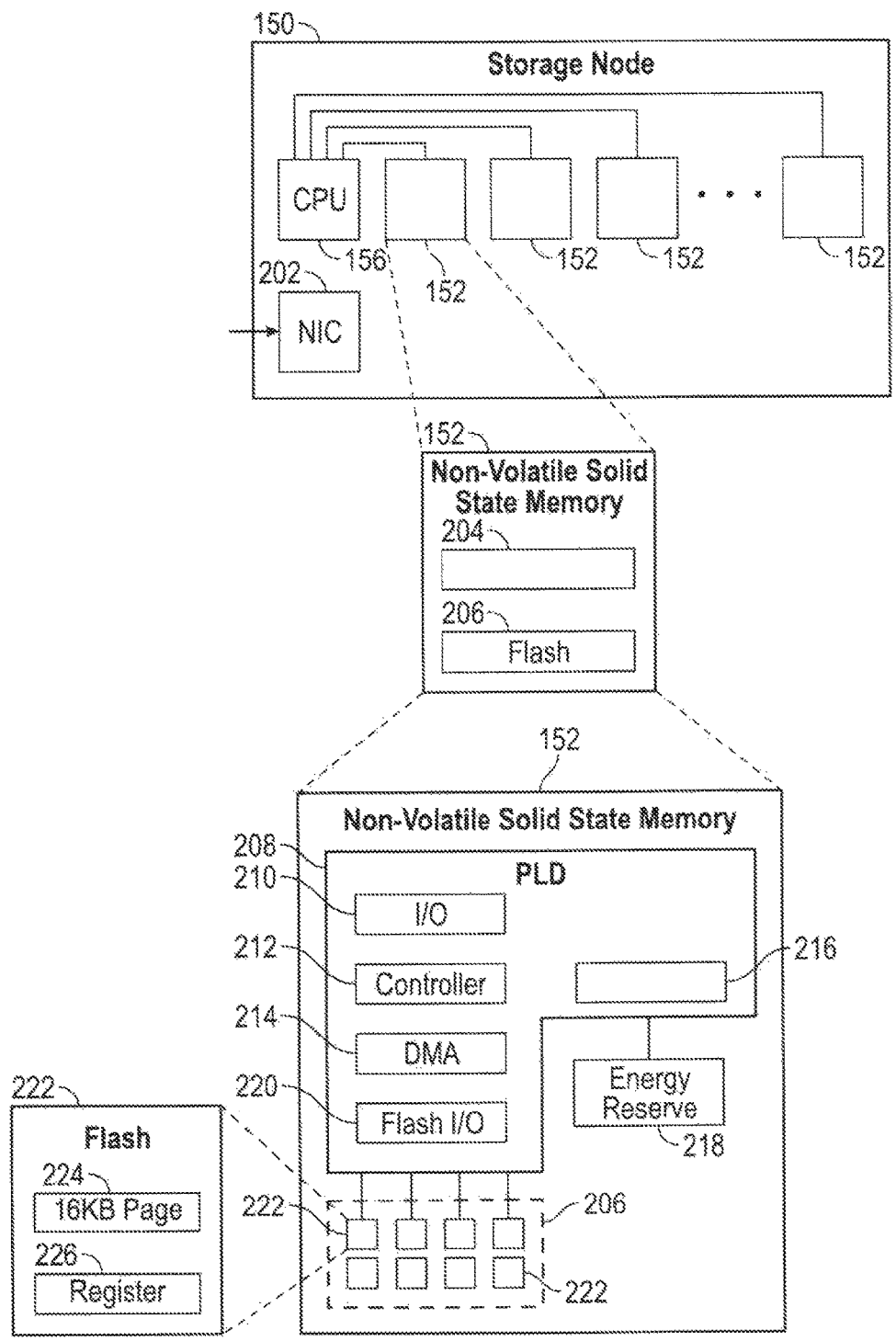
FIG. 3 is a multiple level block diagram, showing contents of a storage node and contents of one of the non-volatile solid state storage units in accordance with some embodiments.

FIG. 3 is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 3, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 3, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 160, in various embodiments as disclosed herein, can be contrasted with storage arrays in general. The storage nodes 150 are part of a collection that creates the storage cluster 160. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 160, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 4:
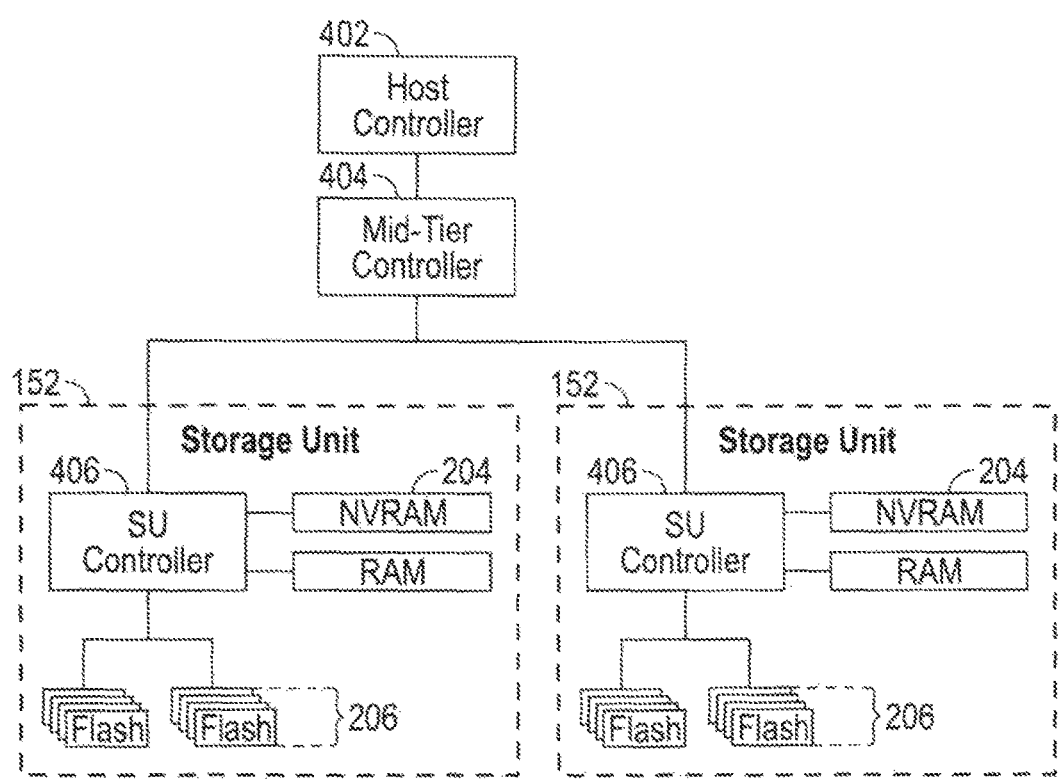
FIG. 4 shows a storage server environment, which uses embodiments of the storage nodes and storage units of FIGS. 1-3.

FIG. 4 shows a storage server environment, which uses embodiments of the storage nodes 150 and storage units 152 of FIGS. 1-3. In this version, each storage unit 152 has a processor such as controller 212 (see FIG. 3), an FPGA (field programmable gate array), flash memory 206, and NVRAM 204 (which may be super-capacitor backed DRAM 216, see FIG. 3) on a PCIe (peripheral component interconnect express) board in a chassis 138 (see FIG. 1). The storage unit 152 may be implemented as a single board containing storage, and may be the largest tolerable failure domain inside the chassis. In some embodiments, up to two storage units 152 may fail and the device will continue with no data loss.

The physical storage is divided into named regions based on application usage in some embodiments. The NVRAM 204 is a contiguous block of reserved memory in the storage unit 152 DRAM 216, and is backed by NAND flash. NVRAM 204 is logically divided into multiple memory regions written for two as spool (e.g., spool_region). Space within the NVRAM 204 spools is managed by each authority 512 independently. Each device provides an amount of storage space to each authority 512. That authority 512 further manages lifetimes and allocations within that space. Examples of a spool include distributed transactions or notions. When the primary power to a storage unit 152 fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 512. This distribution of logical control is shown in FIG. 4 as a host controller 402, mid-tier controller 404 and storage unit controller(s) 406. Management of the control plane and the storage plane are treated independently, although parts may be physically co-located on the same blade. Each authority 512 effectively serves as an independent controller. Each authority 512 provides its own data and metadata structures, its own background workers, and maintains its own lifecycle.

Figure 5:
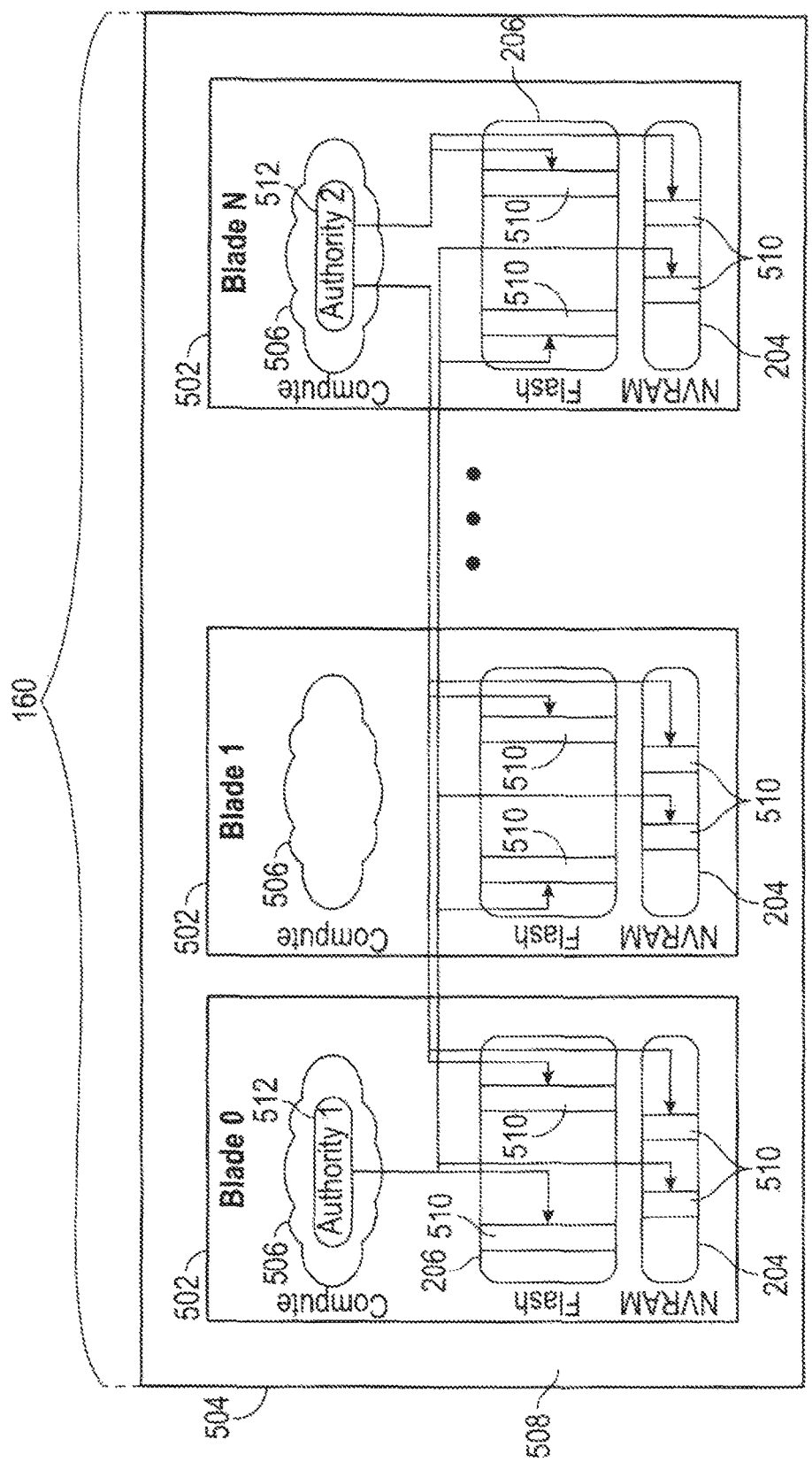
FIG. 5 is a blade hardware block diagram, showing a control plane, compute and storage planes, and authorities interacting with underlying physical resources to perform distributed transactions, using embodiments of the storage nodes and storage units of FIGS. 1-3 in the storage server environment of FIG. 4.

FIG. 5 is a blade 502 hardware block diagram, showing a control plane 504, compute and storage planes 506, 508, and authorities 512 interacting with underlying physical resources to perform distributed transactions, using embodiments of the storage nodes 150 and storage units 152 of FIGS. 1-3 in the storage server environment of FIG. 4. The control plane 504 is partitioned into a number of authorities 512 which can use the compute resources in the compute plane 506 to run on any of the blades 502. The storage plane 508 is partitioned into a set of devices, each of which provides access to flash 206 and NVRAM 204 resources. In the compute and storage planes 506, 508 of FIG. 5, the authorities 512 interact with the underlying physical resources (i.e., devices). From the point of view of an authority 512, its resources are striped over all of the physical devices. From the point of view of a device, it provides resources to all authorities 512, irrespective of where the authorities happen to run. In order to communicate and represent the ownership of an authority 402, including the right to record persistent changes on behalf of that authority 402, the authority 402 provides some evidence of authority ownership that can be independently verifiable. A token is employed for this purpose and function in one embodiment, although other techniques are readily devised.

Still referring to FIG. 5, each authority 512 has allocated or has been allocated one or more partitions 510 of storage memory in the storage units 152, e.g. partitions 510 in flash memory 206 and NVRAM 204. Each authority 512 uses those allocated partitions 510 that belong to it, for writing or reading user data. Authorities can be associated with differing amounts of physical storage of the system. For example, one authority 512 could have a larger number of partitions 510 or larger sized partitions 510 in one or more storage units 152 than one or more other authorities 512. The above-described storage systems and storage clusters, and variations thereof, and various further storage systems and storage clusters are suitable for distributed flash wear leveling, as described below with reference to FIGS. 6-13. It should be appreciated that, although described with flash memory, the teachings herein are applicable to other types of solid-state memory and other types of storage memory.

Figure 6:
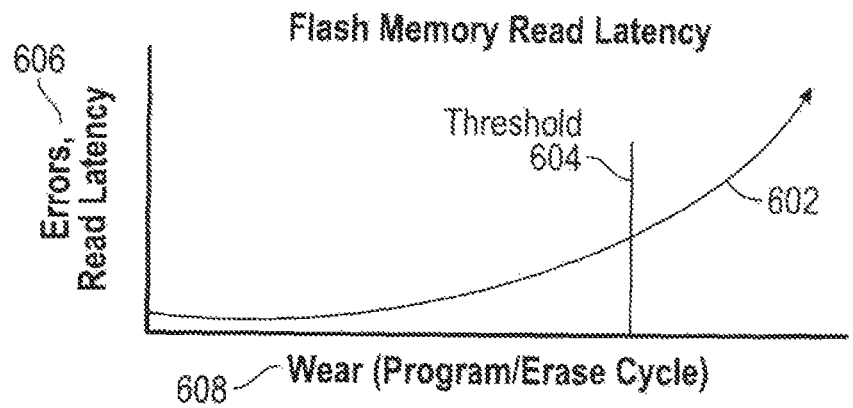
FIG. 6 is a graph of flash memory read latency, showing the number of errors and the read latency increasing with increased wear from program/erase cycles.

FIG. 6 is a graph of flash memory read latency 606, showing the number of errors and the read latency increasing with increased wear 608 from program/erase cycles. While not drawn to scale, the trend of the plot 602 is typical of flash memory of various types. To the left of a threshold 604, which could be determined theoretically or empirically, flash memory that has less than the threshold 604 amount of wear from program/erase cycles has an acceptable number of errors and corresponding read latency 606. To the right of the threshold 604, flash memory that has more than the threshold 604 amount of wear from program/erase cycles has a larger and unacceptable number of errors and greater corresponding read latency 606. The reason read latency 606 for data is related to errors is that error correction of data has a computational time cost, so data (and memory locations or portions) with no errors has the fastest read latency or fastest read access. Memory locations or portions of memory that have higher error rates have, on average, longer access times or higher or longer read latency because of the amount of time the storage system takes to correct the errors and produce error corrected data. It should be noted that, for purposes of discussion of effects of flash memory wear, the terms access time, access rate, read time, read rate, access latency and read latency are treated as closely related.

Figure 7:
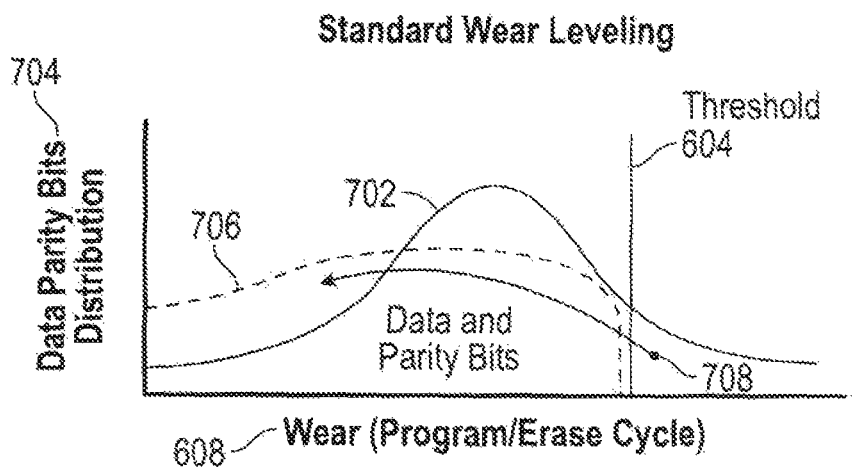
FIG. 7 is a graph illustrating standard wear leveling, in which data and parity bits are distributed relatively evenly to locations and portions of flash memory at various levels of wear, to avoid having data and parity in locations and portions of flash memory that have more wear than an established threshold.

FIG. 7 is a graph illustrating standard wear leveling, in which data and parity bits are distributed relatively evenly to locations and portions of flash memory at various levels of wear, to avoid having data and parity in locations and portions of flash memory that have more wear than an established threshold. Two plots 702, 706 are shown in the graph to illustrate the difference between data and parity bits distribution 704 without wear leveling, in the plot 702 drawn with a solid line, and with wear leveling, in the plot 706 drawn with a dashed line. For example, without wear leveling, the plot 702 of distribution 704 of data and parity bits with respect to wear 608 might be a random, roughly Gaussian curve, or could have spikes where a lot of data has been written, or even gaps where erasure has occurred, and no data has been written recently. With wear leveling, as depicted in the plot 706, the distribution 704 of data and parity bits is more even with respect to wear 608, making good use of all available flash memory at all levels of wear 608 below the wear threshold 604. Desirably, in some versions of wear leveling, any data that is in a section of flash memory with wear 608 greater than the wear threshold 604 should be relocated (i.e., read and rewritten) to a section of flash memory with wear 608 lower than the wear threshold 604, as shown in the relocation action 708.

It should be appreciated that standard wear leveling, as shown in FIG. 7, results in a wide range of access times and read latencies for the data, according to the wear 608 and as shown in FIG. 6. This is a result of standard wear leveling distributing data bits and parity bits to flash memory throughout the range of wear 608, without distinguishing between data bits and parity bits as to location relative to wear 608. A correlation of the curves depicted in FIGS. 6 and 7 would show that, as data is added to a storage system, and as the flash memory wears from program/erase cycles, ever increasing amounts of data have larger read latencies. This is not desirable and is seen as a deterioration of the storage system. Various embodiments of data distribution with distributed flash wear leveling, as depicted in FIGS. 8-13, address this situation and improve upon read latency as compared to standard wear leveling.

Figure 8:
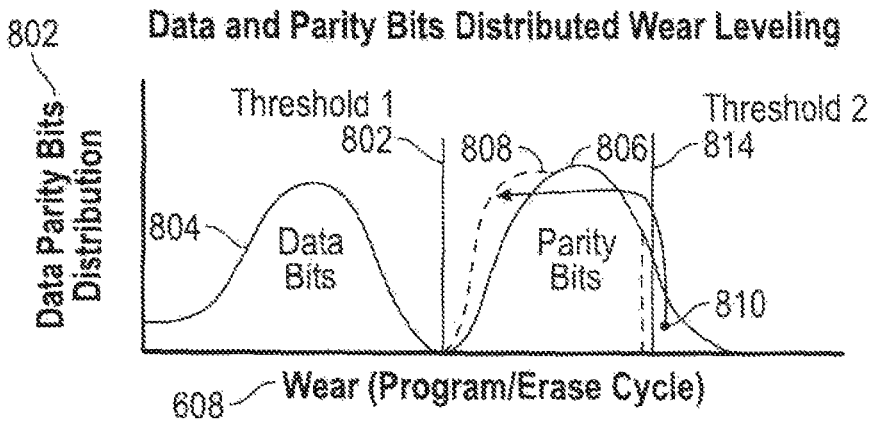
FIG. 8 is a graph illustrating data and parity bits with distributed wear leveling, with data bits written to locations and portions of flash memory having less wear and lower read latency, and parity bits written to locations and portions of flash memory having more wear and higher read latency, in accordance with the present disclosure.

FIG. 8 is a graph illustrating data and parity bits with distributed wear leveling, with data bits written to locations and portions of flash memory having less wear and lower read latency, and parity bits written to locations and portions of flash memory having more wear and higher read latency, in accordance with the present disclosure. Many forms of erasure coding have data bits and parity bits that are eligible for distributed wear leveling. Data and parity bits distribution 802, rather than being mixed and combined together as in standard wear leveling, is split in this technique. One plot 804 shows the data bits written to locations or portions of flash memory that have less wear 608 than a first threshold 802, labeled "threshold 1". Another plot 806 shows parity bits written to locations or portions of flash memory that have greater wear 608 than the first threshold 802. In some versions, a second threshold 814, labeled "threshold 2" of wear 608 is established, which could be related to the threshold 604 shown in FIGS. 6 and 7. Parity bits in locations or portions of flash memory that have more wear 608 than this second threshold 814 are relocated to locations or portions of flash memory that have more wear 608 than the first threshold 802 but less wear than the second threshold 814. This is depicted in the dashed line plot 808 and the relocation action 810. A result of this distributed wear leveling is that the data bits can be read with less latency than the parity bits, since the data bits are read from flash memory that has less wear and less errors, on average, and the parity bits are read from flash memory that has more wear and more errors, on average, and resultant higher read latency.

Reads of the data bits with distributed wear leveling as shown in FIG. 8 will on average need error correction less often than reads of data bits with standard wear leveling, as shown in FIG. 7, since the distributed wear leveling technique concentrates the data bits in the locations and portions of flash memory that have less wear 608 and lower error rates (see FIG. 6). Since the computational overhead and time cost for error correction is avoided, reads of the data bits will have lower read latency on average as compared to standard wear leveling. On those less frequent occasions when the parity bits are needed for error correction, reading the parity bits will incur a greater read latency on average as compared to standard wear leveling, and will incur computational overhead to perform the error correction. This may slightly offset the advantages gained in read latency, but not to the point of negating the value of distributed wear leveling. A variation of the graph shown in FIG. 8 could be produced by substituting read latency or access time for wear 608 on the horizontal axis, and distributing the data bits to the lower read latency or access time locations or portions of flash memory, and parity bits to the higher read latency or access time locations or portions of flash memory. Since read latency and wear 608 are closely related in embodiments as described above, these two graphs and the effects on average data read latency would be likewise closely related.

A storage system that uses RAID stripes, such as described herein with reference to FIGS. 1-5, can benefit from distributed wear leveling as shown in FIG. 8 by primarily reading the data bits for a data read access, and only reading the parity bits if there is some other type of failure in the system, such as a failure of a storage node 150 or a storage unit 152. The storage system selectively biases where data bits and parity bits are placed (i.e., written) in erasure coded data striping across the storage nodes 150. Various schemes and variations for data and parity placement are further described below.

Figure 9:
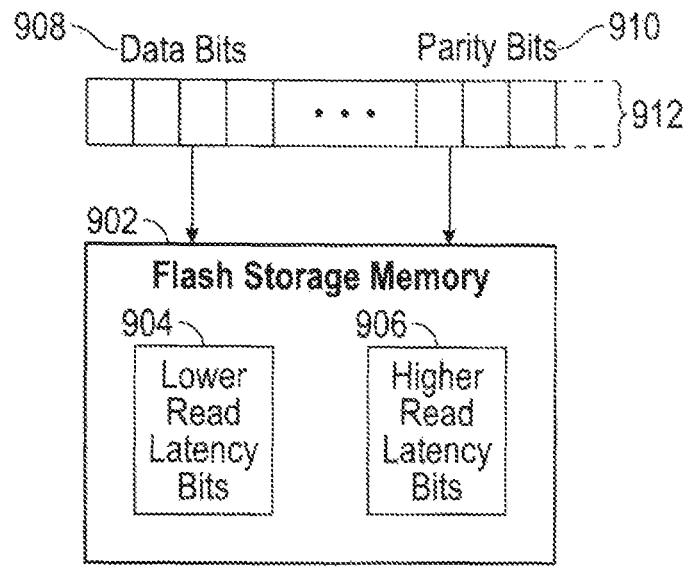
FIG. 9 is a data distribution diagram showing distribution of data bits to lower read latency bits in flash storage memory, and parity bits to higher read latency bits in flash storage memory.

FIG. 9 is a data distribution diagram showing distribution of data bits 908 to lower read latency bits 904 in flash storage memory 902, and parity bits 910 to higher read latency bits 906 in flash storage memory 902. In one embodiment, the bits of a data stripe 902 are composed of data bits 908 and parity bits 910 for a specified erasure coding scheme determined by an authority 168 in a storage node 150 as described above with reference to FIGS. 1-3 in embodiments of a storage cluster 160. The flash storage memory 902 is in storage units 152 coupled to storage nodes 150, as described with reference to FIGS. 1-5. In further embodiments, the data bits 908 and parity bits 910 are bits of a data word, data segment or other portion of data in some other storage system.

There are multiple ways that a storage system could determine which portions or sections of a flash storage memory 902 have the lower read latency bits 904 and the higher read latency bits 906. For example, the storage system could track errors or error rates, and determine which portions of flash storage memory 902 have lower errors or lower error rates, using these as the lower read latency bits 904. Relatedly, the portions of flash storage memory 902 that have higher errors or higher error rates are used as the higher read latency bits 906. As another example, the storage system could timestamp, or otherwise track, age of memory and determine that some flash memory is recently replaced and therefore has less wear than longer-used flash memory. The storage system could determine that some portions of flash storage memory 902 are a newer, faster type or design of flash memory, and use these for the lower read latency bits 904. Once the lower read latency bits 904 and higher read latency bits 906 are determined, the system can then write data bits 908 to the lower read latency bits 904, and parity bits 910 to the higher read latency bits 906. The above techniques achieve the distributed wear leveling depicted in FIG. 8 with wear 608 on the horizontal axis, or as described in the variation graph with read latency on the horizontal axis. In a further variation, a storage system could further subdivide each of the portions of flash memory according to access rate and direct writing of the data bits and parity bits to corresponding subdivisions based on frequency of access. This could be done for hot data and cold data, i.e., more frequently accessed or more recently accessed data and less frequently accessed or less recently accessed data.

Figure 10:
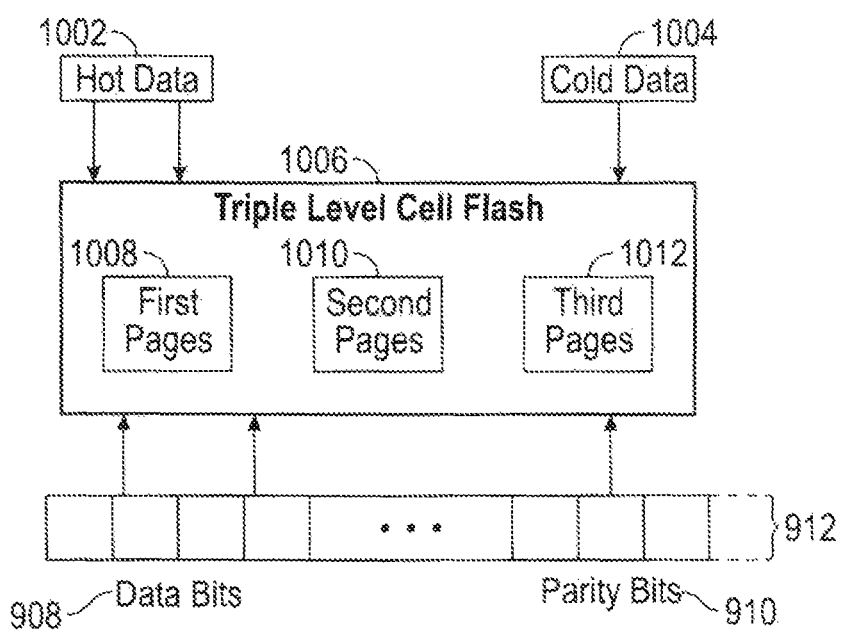
FIG. 10 is a block diagram showing distribution of data to first, second and third pages in triple level cell flash memory.

FIG. 10 is a block diagram showing distribution of data to first pages 1008, second pages 1010 and third pages 1012 in triple level cell flash 1006 memory. This type of triple level cell flash 1006 has a characteristic that the first bit in a cell, and the second bit in the cell, are determined more quickly than the third bit in the cell, which characteristic manifests as the first pages 1008 and the second pages 1010 having faster access or lower read latency than the third pages 1012. A storage system can take advantage of this characteristic, and write hot data 1002 (i.e., frequently or recently accessed data) to the first pages 1008 and second pages 1010 of the triple level cell flash 1006, and write cold data 1004 (i.e., infrequently or less recently accessed data) to the third pages 1012 of the triple level cell flash 1006. Doing so results in the hot data 1002 having a faster access or lower read latency, and the cold data 1004 having a slower access or longer, higher read latency. This is one of several mechanisms of associating data that is more frequently accessed or more recently accessed to a first access rate, and data that is less frequently accessed or less recently accessed to a second access rate.

A storage system can take further advantage of the above characteristic of this type of flash memory, and write data bits 908 to the first pages 1008 and second pages 1010 of the triple level cell flash 1006, and parity bits 910 to the third pages 1012 of the triple level cell flash 1006. Doing so results in the data bits 908 having a faster access or lower read latency, and the parity bits having a slower access or longer, higher read latency. These two techniques can be combined, or one or the other practiced, in variations.

Figure 11:
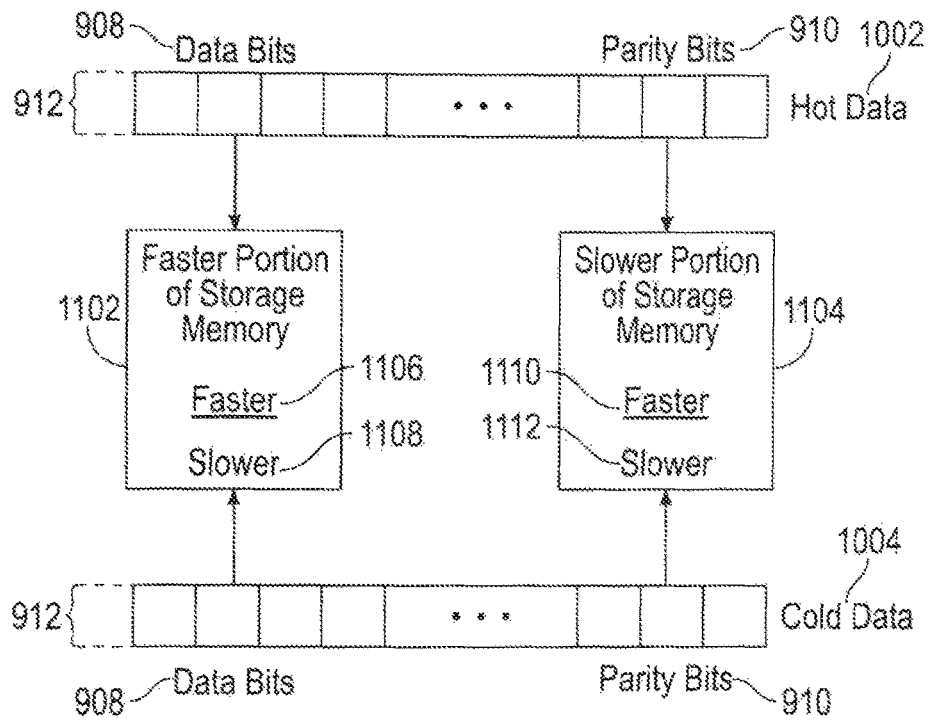
FIG. 11 is a data distribution diagram showing distribution of data bits and parity bits of hot data and cold data to subdivisions of faster and slower access portions of storage memory.

FIG. 11 is a data distribution diagram showing distribution of data bits 908 and parity bits 910 of hot data 1002 and cold data 1004 to subdivisions 1106, 1108, 1110, 1112 of faster and slower access portions 1102, 1104 of storage memory. In this embodiment, the storage system determines which portion of storage memory has faster access, and which portion of storage memory has slower access, e.g., by tracking errors or error rates, tracking program/erase cycles, determining which portions have newer, less used memory, determining which portions have a faster access design or type of flash memory, determining which portions of triple level cell flash have first, second or third pages 1008, 1010, 1012, or other analysis technique. Then, the storage system looks at the faster portion of storage memory 1102, and subdivides this into a faster subdivision or portion 1106, and a slower subdivision or portion 1108 of the faster portion of storage memory 1102. Also, the storage system looks at the slower portion of storage memory 1104, and subdivides this into a faster portion or subdivision 1110 and a slower subdivision or portion 1112 of the slower portion of storage memory 1104. This is accomplished by applying any of the above-discussed techniques to further subdivide portions of storage memory.

In one embodiment, the storage system recognizes which storage units 152 have newer design or type or newer, less used (e.g., less program/erase cycles) flash memory, declaring these as having the faster portion of storage memory 1102, with other storage units 152 having the slower portion of storage memory 1104. Then, each storage unit 152 could be sorted or graded according to program/erase cycles or error amounts or rates and subdivided into faster and slower portions. Another example is to have the storage system track blocks of flash memory and assign these into four groups, or two major groups each having two minor groups within, according to access speed or latency, or errors or error rates, etc. Address translation and/or mapping could be applied in this and other embodiments.

Once the storage memory is divided and subdivided, the storage system then assigns portions of data to the divided and subdivided portions of storage memory. Data bits 908 of the hot data 1002 are written to the faster subdivision or portion 1106 of the faster portion of storage memory 1102. Parity bits 910 of the hot data 1002 are written to the faster subdivision or portion 1110 of the slower portion of storage memory 1104. Data bits 908 of the cold data 1004 are written to the slower subdivision or portion 1108 of the faster portion of storage memory 1102. Parity bits 910 of the cold data 1004 are written to the slower subdivision or portion 1112 of the slower portion of storage memory 1104. This gives precedence to hot data 1002, with the fastest access for the data bits 908 of the hot data 1002. Data bits 908 of both the hot data 1002 and the cold data 1004 are read from the faster portion of storage memory 1102, for faster access and lower read latency as compared to the slower portion of storage memory 1104.

Figure 12:
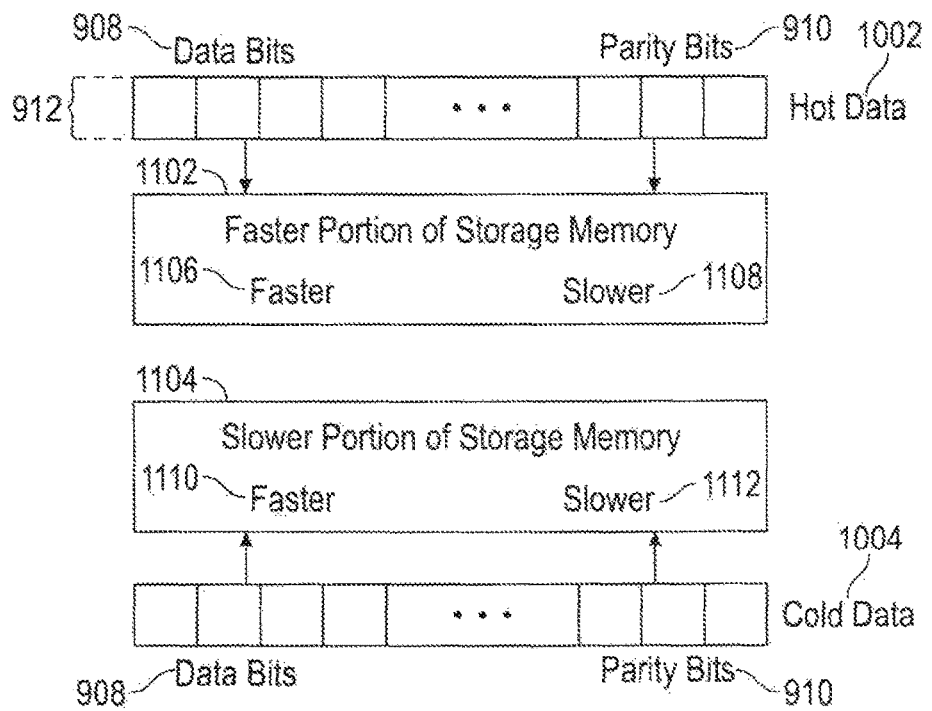
FIG. 12 is a data distribution diagram showing a variation on the distribution technique shown in FIG. 11.

FIG. 12 is a data distribution diagram showing a variation on the distribution technique shown in FIG. 11. In this version, the hot data 1002 is accessed from the faster portion of storage memory 1102, and the cold data 1004 is accessed from the slower portion of storage memory 1104. Data bits 908 of the hot data 1002 are written to the faster subdivision or portion 1106 of the faster portion of storage memory 1102. Parity bits 910 of the hot data 1002 are written to the slower subdivision or portion 1108 of the faster portion of storage memory 1102. Data bits 908 of the cold data 1004 are written to the faster subdivision or portion 1110 of the slower portion of storage memory 1104. Parity bits 910 of the cold data 1004 are written to the slower subdivision or portion 1112 of the slower portion of storage memory 1104. This also gives precedence to the hot data 1002, with both data bits 908 and parity bits 910 of the hot data 1002 being read from the faster portion of storage memory 1102. Data bits 908 of both the hot data 1002 and the cold data 1004 are read from faster subdivisions or portions 1106, 1110 of the storage memory and benefit from faster read latency relative to the parity bits 910.

Figure 13:
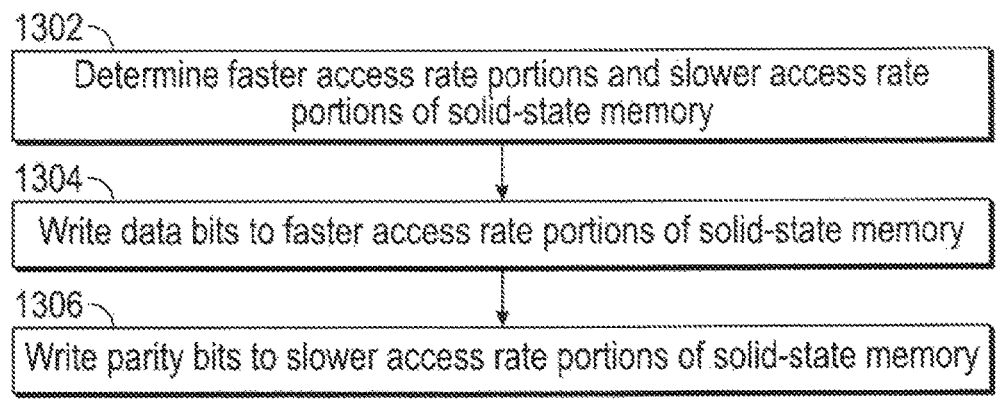
FIG. 13 is a flow diagram of a method for storing data in a storage system that has solid-state memory.

FIG. 13 is a flow diagram of a method for storing data in a storage system that has solid-state memory. The method can be practiced by a processor, more specifically by a processor in a storage system. Embodiments of a storage system or storage cluster with storage nodes described herein can practice the method or variations thereof. Each storage node can identify the various portions or subdivisions of solid-state memory, and write data bits and parity bits according to the method. In an action 1302, faster access rate portions and slower access rate portions of solid-state memory are determined. For example, a processor could base such determination on tracking errors or error rates, tracking program/erase cycles, designs or types of flash memory, age of flash memory, or other factors of solid-state memory.

In an action 1304, data bits are written to faster access rate portions of solid-state memory. This gives priority to the data bits, which then have the faster access rate so that on average, the lead latency of the storage system is improved as compared to standard wear leveling. In an action 1306, parity bits are written to slower access rate portions of solid-state memory. When there is an error, the parity bits and the data bits can be used to reconstruct the data. Variations of the above method include further subdividing the faster access rate portions and the slower access rate portions of solid-state memory into relatively faster and slower subdivisions, and writing data bits and parity bits of hot data and cold data to the subdivisions in accordance with access rates, in various combinations, as described above. The data bits of the hot data could be written to the faster subdivision or portion of the faster portion of storage memory so as to have the fastest access and lowest read latency.

Figure 14:
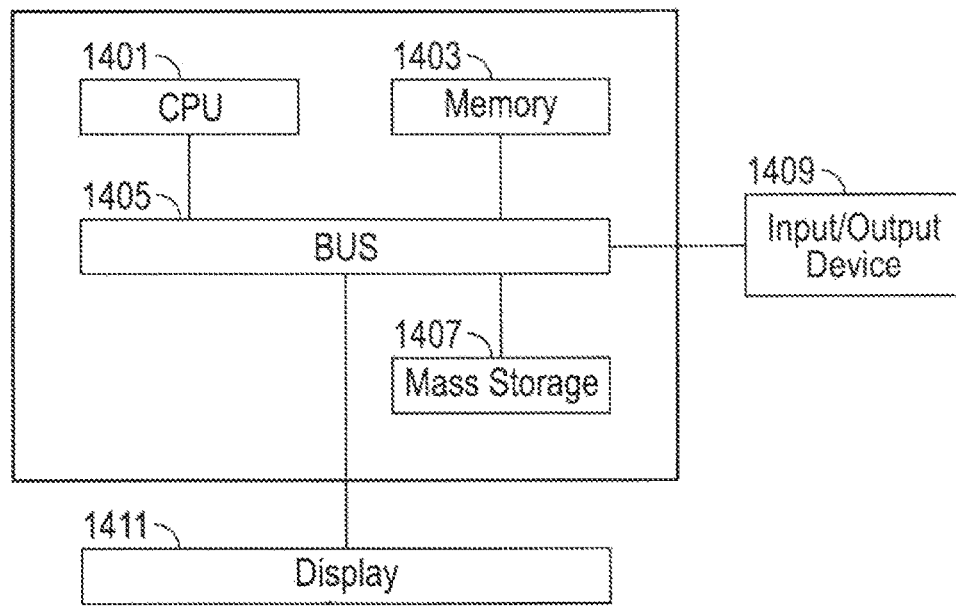
FIG. 14 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 14 is an illustration showing an exemplary computing device which may implement the embodiments described herein. The computing device of FIG. 14 may be used to perform embodiments of the functionality for the operating a storage system, with or without distributed flash wear leveling in accordance with various embodiments. The computing device includes a central processing unit (CPU) 1401, which is coupled through a bus 1405 to a memory 1403, and mass storage device 1407. Mass storage device 1407 represents a persistent data storage device such as a floppy disc drive or a fixed disc drive, which may be local or remote in some embodiments. Memory 1403 may include read only memory, random access memory, etc. Applications resident on the computing device may be stored on or accessed via a computer readable medium such as memory 1403 or mass storage device 1407 in some embodiments. Applications may also be in the form of modulated electronic signals modulated accessed via a network modem or other network interface of the computing device. It should be appreciated that CPU 1401 may be embodied in a general-purpose processor, a special purpose processor, or a specially programmed logic device in some embodiments.

Display 1411 is in communication with CPU 1401, memory 1403, and mass storage device 1407, through bus 1405. Display 1411 is configured to display any visualization tools or reports associated with the system described herein. Input/output device 1409 is coupled to bus 1405 in order to communicate information in command selections to CPU 1401. It should be appreciated that data to and from external devices may be communicated through the input/output device 1409. CPU 1401 can be defined to execute the functionality described herein to enable the functionality described with reference to FIGS. 1-13. The code embodying this functionality may be stored within memory 1403 or mass storage device 1407 for execution by a processor such as CPU 1401 in some embodiments. The operating system on the computing device may be MS-WINDOWS™, OS/2™, UNIX™ LINUX™, iOS™ or other known operating systems. It should be appreciated that the embodiments described herein may also be integrated with a virtualized computing system that is implemented with physical computing resources.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A storage system, comprising:
a plurality of storage nodes having solid-state memory, each storage node of the plurality of storage nodes configurable to write data across the plurality of storage nodes using erasure coding, each portion of data having a plurality of data bits and one or more parity bits; and
each storage node of the plurality of storage nodes configurable to identify portions of the solid-state memory having a first access rate and portions of the solid state memory having a second access rate, the first access rate faster than the second access rate; and
each storage node of the plurality of storage nodes configurable to write the data bits to the portions of the solid-state memory having the first access rate and write the one or more parity bits to the portions of the solid-state memory having the second access rate.

2. The storage system of claim 1, wherein each storage node of the plurality of storage nodes is configurable to determine amounts or rates of error associated with differing portions of the solid-state memory, wherein the portions of the solid-state memory having the first access rate include portions of the solid-state memory having lesser amounts or rates of error and the portions of memory having the second access rate include portions of the solid-state memory having greater amounts or rates of error.

3. The storage system of claim 1, wherein the solid state memory includes triple level cell (TLC) flash memory, and wherein each storage node of the plurality of storage nodes is configurable to identify access rates associated with a first portion of the TLC flash memory and a second portion of the TLC flash memory, the first portion of the TLC flash memory having a faster access rate than the second portion of the TLC flash memory, wherein the portions of the solid-state memory having the first access rate include the first portion of the TLC flash memory and the portions of the solid-state memory having the second access rate include the second portion of the TLC flash memory.

4. The storage system of claim 1, wherein each storage node of the plurality of storage nodes is configurable to determine which portions of the solid-state memory have a type of flash memory having faster access and which portions of the solid-state memory have a type of flash memory having slower access, with the portions of the solid-state memory having the first access rate including the portions of the solid-state memory having the type of flash memory having faster access, and the portions of the solid-state memory having the second access rate including the portions of the solid-state memory having the type of flash memory having slower access.

5. The storage system of claim 1, wherein each storage node of the plurality of storage nodes is configurable to identify sections of the solid-state memory having fewer program or erase cycles, wherein the portions of the solid-state memory having the first access rate include the sections of the solid-state memory having fewer program or erase cycles, and the portions of the solid-state memory having the second access rate include remaining sections of the solid-state memory.

6. The storage system of claim 1, further comprising:
each of the plurality of storage nodes configurable to further subdivide each of the portions of the solid-state memory according to access rate and direct writing of the data bits and the parity bits to corresponding subdivisions based on frequency of access.

7. The storage system of claim 1, wherein:
the solid-state memory includes triple level cell flash memory having slower access pages and faster access pages;
the triple level cell flash memory includes slower access blocks and faster access blocks; and
each of the plurality of storage nodes is configurable to;
write the data bits of a first portion of data to the faster access pages of the faster access blocks, the first portion of data being more recently accessed or more frequently accessed than a second portion of data;
write the one or more parity bits of the first portion of data to the faster access pages of the slower access blocks;
write the data bits of the second portion of data to the slower access pages of the faster access blocks; and
write the one or more parity bits of the second portion of data to the slower access pages of the slower access blocks.

8. A solid-state memory storage system, comprising:
a plurality of storage nodes, at least a portion of the plurality of storage nodes having triple level cell flash memory for storage, the triple level cell flash memory having first pages with a first access rate and second pages with a second access rate, the first access rate faster than the second access rate;
each of the plurality of storage nodes configurable to associate the first access rate to first data and associate the second access rate to second data; and
each of the plurality of storage nodes configurable to write the first data to the first pages having the first access rate and write the second data to the second pages having the second access rate.

9. The storage system of claim 8, wherein each of the plurality of storage nodes is configurable to associate the first access rate to the first data that is more frequently accessed or more recently accessed data relative to the second data.

10. The storage system of claim 8, wherein:
data to be written across the plurality of storage nodes is erasure coded and includes data bits and one or more parity bits;
the first data is the data bits; and
the second data is the one or more parity bits.

11. The storage system of claim 8, wherein each of the plurality of storage nodes is configurable to associate the first access rate to the first data that is more frequently accessed or more recently accessed data relative to the second data; and
each of the plurality of storage nodes is configurable to;
write data bits of the first data to a first subset of the first pages having fewer program or erase cycles than a second subset of the first pages;
write one or more parity bits of the first data to the second subset of the first pages;
write data bits of the second data to a first subset of the second pages having fewer program or erase cycles than a second subset of the second pages; and
write one or more parity bits of the second data to the second subset of the second pages.

12. The storage system of claim 8, wherein each of the plurality of storage nodes is configurable to associate the first access rate to the first data that is more frequently accessed or more recently accessed data relative to the second data; and
each of the plurality of storage nodes is configurable to;
write data bits of the first data to a first subset of the first pages having fewer program or erase cycles than a second subset of the first pages;
write one or more parity bits of the first data to a first subset of the second pages having fewer program or erase cycles than a second subset of the second pages;
write data bits of the second data to the second subset of the first pages; and
write one or more parity bits of the second data to the second subset of the second pages.

13. The storage system of claim 8, wherein each of the plurality of storage nodes is configurable to associate the first access rate to the first data that is more frequently accessed or more recently accessed data relative to the second data; and
each of the plurality of storage nodes is configurable to;
write data bits of the first data to a first subset of the first pages on a first subset of the plurality of storage nodes;
write one or more parity bits of the first data to a second subset of the first pages on a second subset of the plurality of storage nodes;
write data bits of the second data to a first subset of the second pages on the first subset of the plurality of storage nodes; and
write one or more parity bits of the second data to a second subset of the second pages on the second subset of the plurality of storage nodes.

14. A method for storing data in a storage system having solid-state memory, comprising:

determining portions of the solid-state memory that have a faster access rate and portions of the solid-state memory that have a slower access rate, relative to each other or to a threshold;
writing data bits of erasure coded data to the portions of the solid-state memory having the faster access rate; and
writing one or more parity bits of the erasure coded data to the portions of the solid-state memory having the slower access rate.

15. The method of claim 14, wherein the determining comprises:
determining first portions of the solid-state memory that have lesser amounts or rates of error and second portions of the solid-state memory that have greater amounts or rates of error, relative to each other or to an error threshold.

16. The method of claim 14, wherein the determining comprises:
identifying first portions of the solid-state memory having the faster access rate as a first characteristic of triple level cell flash memory and second, differing portions of the solid-state memory having the slower access rate as a second characteristic of triple level cell flash memory.

17. The method of claim 14, wherein the determining comprises:
determining first portions of the solid-state memory that have a faster access type or design of flash memory and second portions of the solid-state memory that have a slower access type or design of flash memory.

18. The method of claim 14, wherein the determining comprises:
determining first portions of the solid-state memory that have fewer program or erase cycles and second portions of the solid-state memory that have more program or erase cycles.

19. The method of claim 14, further comprising:
determining faster access sub portions and slower access sub portions of the portions of the solid-state memory having the faster access rate, and faster access sub portions and slower access sub portions of the portions of the solid-state memory having the slower access rate;
writing the data bits of more frequently accessed or more recently accessed data to the faster access sub portions of the portions of the solid-state memory having the faster access rate; and
writing the one or more parity bits of the more frequently accessed or more recently accessed data to the faster access sub portions of the portions of the solid-state memory having the slower access rate.

20. The method of claim 14, further comprising:
writing the data bits of more frequently accessed or more recently accessed data to faster access pages of triple level cell flash memory in the portions of the solid-state memory having the faster access rate; and
writing the one or more parity bits of the more frequently accessed or more recently accessed data to faster access pages of the triple level cell flash memory in the portions of the solid-state memory having the slower access rate.

* * * * *